United States Patent [19]

Jones

[11] Patent Number: 5,347,147

[45] Date of Patent: Sep. 13, 1994

[54] LIGHT EMITTING DIAMOND DEVICE

[76] Inventor: Barbara L. Jones, 80 Chisbury Close, Forest Park, Bracknell, RG 12 3TX, England

[21] Appl. No.: 163,392

[22] Filed: Dec. 6, 1993

Related U.S. Application Data

[63] Continuation of Ser. No. 800,226, Nov. 29, 1991, abandoned.

[30] Foreign Application Priority Data

Nov. 28, 1990 [GB] United Kingdom ............ 9025837.7

[51] Int. Cl.⁵ .................. H01L 33/00; H01L 31/12; H01L 31/16; H01L 49/00
[52] U.S. Cl. ........................... 257/77; 257/76; 257/79; 257/80
[58] Field of Search .................. 340/644; 357/30; 257/77, 79, 80, 76

[56] References Cited

U.S. PATENT DOCUMENTS

| | | | |
|---|---|---|---|
| 5,034,784 | 7/1991 | Yamazaki | 357/17 |
| 5,086,294 | 2/1992 | Kasegi | 340/644 |
| 5,115,147 | 5/1992 | Kusano et al. | 307/311 |

FOREIGN PATENT DOCUMENTS

| | | |
|---|---|---|
| 0390209 | 3/1989 | European Pat. Off. . |
| 0417645 | 3/1991 | European Pat. Off. . |
| 58-88487 | 5/1983 | Japan . |
| 0055862 | 3/1989 | Japan . |

*Primary Examiner*—Jerome Jackson
*Assistant Examiner*—Valencia Martin Wallace
*Attorney, Agent, or Firm*—Scully, Scott, Murphy & Presser

[57] ABSTRACT

A light emitting electronic device has a substrate of transparent intrinsic diamond material with a p-type region formed in it by implantation of boron ions. Discrete transparent layers of diamond material are deposited over the p-type region, each with different electric characteristics. Transparent conductive contacts are formed above the transparent layers, which are separated by a transparent insulation layer, and a conductive contact is applied to the p-type region of the substrate. The different regions of the device emit different colours of light. Various different embodiments and methods of making the device are described.

15 Claims, 3 Drawing Sheets

LIGHT EMITTING DIAMOND DEVICE

This is a continuation of copending application Ser. No. 800,226, filed on Nov. 29, 1991, now abandoned.

BACKGROUND OF THE INVENTION

This invention relates to a method of manufacturing a light-emitting electronic device and to devices produced by the method.

SUMMARY OF THE INVENTION

According to the invention a method of manufacturing a light-emitting electronic device includes the steps of:

providing a substrate of transparent intrinsic diamond material;

implanting p-type ions into the substrate to define a first p-type region in the substrate;

depositing a first transparent layer of diamond material over the p-type region;

forming at least one transparent conductive contact on or adjacent to the first transparent layer; and applying a conductive contact to the first p-type region.

The first transparent layer is preferably deposited by a chemical vapour deposition (CVD) process, and preferably is grown as a single crystal on the substrate.

The first transparent layer may comprise a single region, or may comprise two or more discrete regions of different material.

For example, the first transparent layer may include a region of lightly p-doped diamond, a region of intrinsic diamond, and a region of high growth rate plasma jet-grown diamond, the different regions being separated by insulating material.

Where the first transparent layer comprises two or more discrete regions, a corresponding number of respective transparent conductive contacts may be formed on or adjacent to each region, so that two or more independently controllable light emitting structures are formed in a single substrate.

The transparent conductive contacts may comprise indium tin oxide, for example.

Further according to the invention there is provided a light emitting device comprising:

a substrate of transparent intrinsic diamond material having a p-type region formed therein;

a first transparent layer of diamond material deposited over the p-type region;

at least one transparent conductive contact on or adjacent to the first transparent layer; and a conductive contact applied to the first p-type region.

The invention extends to voltage indicating devices and to light sensitive logic devices incorporating the light emitting electronic devices.

DESCRIPTION OF EMBODIMENTS

Figure 1:
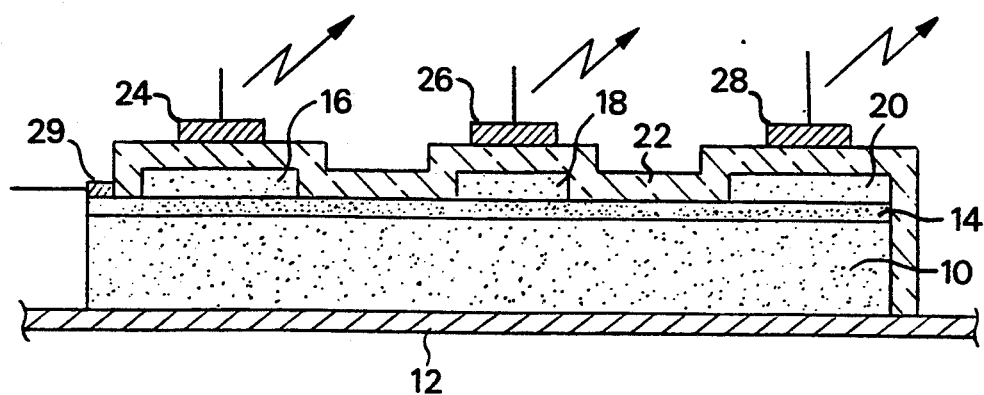
FIG. 1 is a schematic sectional view of a first embodiment of a light-emitting electronic device according to the invention.

Referring first to FIG. 1, a single crystal diamond 10 is fixed to a reflective aluminium base 12. The diamond may be a synthetic or natural type I or type II diamond, but not a type IIB diamond. The upper surface of the diamond crystal 10 is implanted with boron ions to define a shallow p-type region 14 in the diamond substrate. The p-type region has a depth of between 0.5 $\mu$m and 1 $\mu$m. An ion dose of 20 KeV is applied, which provides an ion density of $10^{18}$ to $10^{21}$ boron ions cm$^{-2}$. On top of the p-type region 14 a layer of diamond is deposited by a chemical vapour deposition (CVD) process to define three discrete regions 16, 18 and 20, which are grown as single crystal on the p-type implanted regions of the intrinsic diamond substrate.

The region 16 comprises a lightly p-doped CVD layer while the region 18 comprises intrinsic diamond. For example, the region 16 can be formed by using diborane gas ($B_2H_6$) as a dopant in the CVD process, to obtain a concentration of less than 1000 ppm of boron. The resulting doped region 16 has a low vacancy content. The region 20 is formed by a high growth rate plasma jet CVD process (also known as flame or combustion CVD), resulting in a layer with large numbers of vacancies.

The discrete regions 16, 18 and 20 of the deposited layer are separated and insulated from one another by a transparent insulating layer 22 which may comprise, for example, $HFO_2$, $Al_2O_3$, $SiO_2$ or $SrTiO_3$ (perovskite). The insulating layer can be applied by CVD or PVD techniques. Finally, electrically conductive contacts 24, 26 and 28 comprising separate layers of indium tin oxide are deposited above the respective regions 16, 18 and 20, for example, by sputtering, evaporation or electron beam deposition. A conductive electrical contact 29 is applied to one end of the p-type implanted region 14. The resulting device effectively comprises three separate diodic structures, each of which emits light when sufficiently forward-biased electrically. From left to right in FIG. 1, the three structures emit green, blue and red light respectively.

The method of the invention takes advantage of the transparency of diamond, whether a diamond crystal or a layer deposited by a CVD process, to provide a light emitting device. The use of transparent indium tin oxide contacts and transparent insulating layers ensures that the light emission qualities of the device are not impaired. The aluminium layer 12 in FIG. 1 serves as a reflector, to maximize light emission of the illustrated device.

Devices of the kind described above have numerous possible applications. For example, a multiple-pixel RGB display could be manufactured using a multiplicity of three-colour devices as described. Another application is a multi-colour visible voltage regulator or indicator device, which includes a plurality of switching devices such as diodes, each with a different switching threshold voltage, to provide an integrated device which emits different colour light according to the voltage level applied to it. Another possible application of the invention is in an optical logic device, an example of which is illustrated schematically in FIG. 2.

Figure 2:
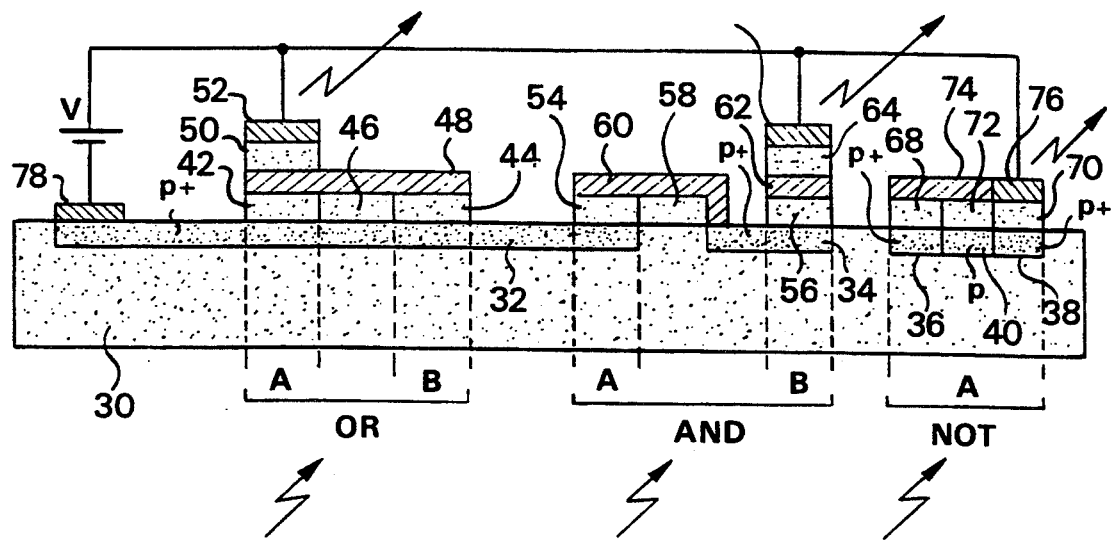
FIG. 2 is a schematic sectional view of an optical logic device incorporating a number of light emitting devices according to the invention.

In FIG. 2, a type Ia single crystal diamond substrate 30 is divided into three regions, which correspond to an OR gate, an AND gate, and a NOT gate. Instead of being electrical gates, the gates are optical, in the sense that they respond to an optical input and provide an optical output. The surface of the diamond substrate is implanted with p-type ions to define a first p+ region 32, a second p+ region 34, and third and fourth p+ regions 38 separated by a p-doped region 40. The p+ region 32 serves as part of both the OR and the AND gates.

Dealing first with the OR gate, a layer of intrinsic diamond comprising first and second regions 42 and 44, separated by an insulating region 46 of $SiO_2$, is deposited by a CVD process as described above. A titanium layer 48 is deposited, for example, by sputtering, above the regions 42, 44 and 46. A further layer 50 of intrinsic diamond is deposited by a CVD process on the titanium layer directly above the region 42 and a transparent conductive contact 52 of indium tin oxide is deposited on top of the layer 50. The contact 52 can be deposited by the same techniques used to produce the contacts 24, 26 and 28.

The AND gate is formed by depositing regions 54 and 56 of intrinsic diamond above the p+ regions 32 and 34. A region 58 of $SiO_2$ separates the p+ layers 32 and 34 at the surface of the substrate 30. A titanium layer 60 is deposited above the regions 54 and 58 and makes contact with the surface of the p+ region 34. A titanium layer 62 is also deposited above the region 56. A further diamond layer 64 is deposited on the titanium layer 62, and an indium tin oxide contact 66 is deposited on the layer 64. The titanium layers 48 and 62 precede the respective diamond deposition layers 50 and 64 in order to withstand the high temperatures involved in the CVD deposition process.

Finally, the NOT gate is formed by depositing diamond regions 68 and 70 above the p+ regions 36 and 38. The diamond regions are separated by an $SiO_2$ insulating region 72, which is deposited above the p-type region 40. An aluminum layer 74 is deposited above the region 68 and 72, while an indium tin oxide contact 76 is deposited on the diamond region 70.

The three indium tin oxide contacts 52, 66 and 76 are connected together to the positive terminal of a voltage source V, while the negative terminal of the voltage source is connected via an indium tin oxide contact 78 to the p+ region 32.

Figure 3:
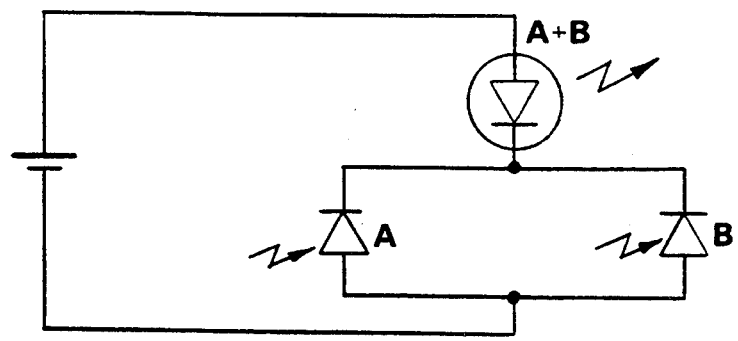
FIGS. 3, 4 and 5 are equivalent circuits of the device of FIG. 2.
Figure 4:
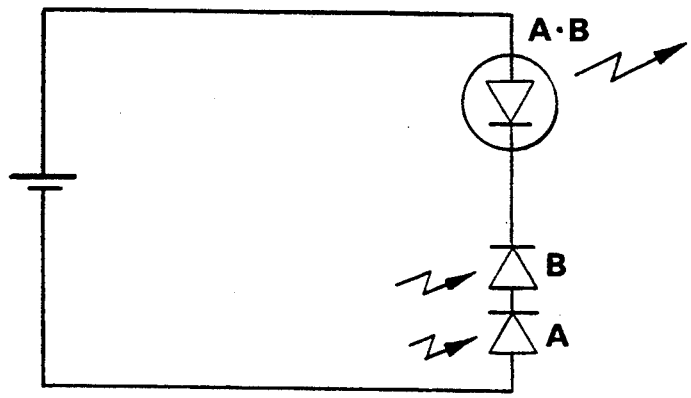
Figure 5:
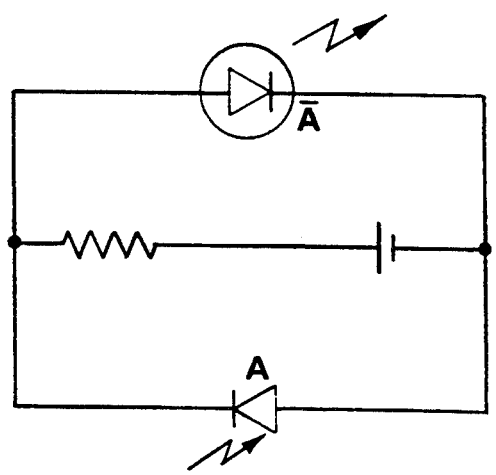

The OR gate has two active input regions marked A and B which correspond to the photodiodes A and B in the schematic diagram of FIG. 3. If either the A or B photodiodes are illuminated, the device emits light, thus effectively providing an OR function. Similarly, if both the photodiode input structures A and B of the AND gate are illuminated, the device emits light. Finally, if the photodiode sensor A of the NOT gate is illuminated, no light will be emitted, while an absence of illumination will cause a light output.

In the described example, using intrinsic diamond layers deposited by a CVD process, blue light is emitted by the respective devices. Obviously, a different colour light output could be obtained by using a different CVD process.

Figure 6:
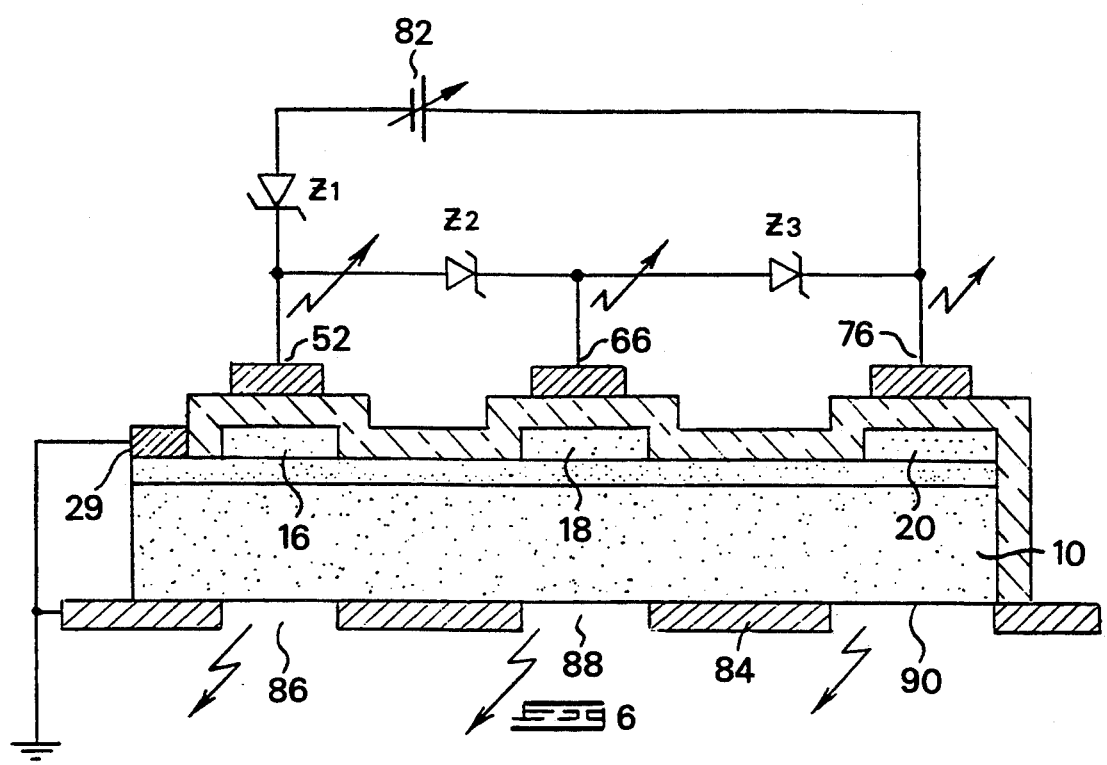
FIG. 6 is a schematic sectional view of a second embodiment of a light-emitting electronic device according to the invention, configured as a voltage indicator or regulator.
Figure 7:
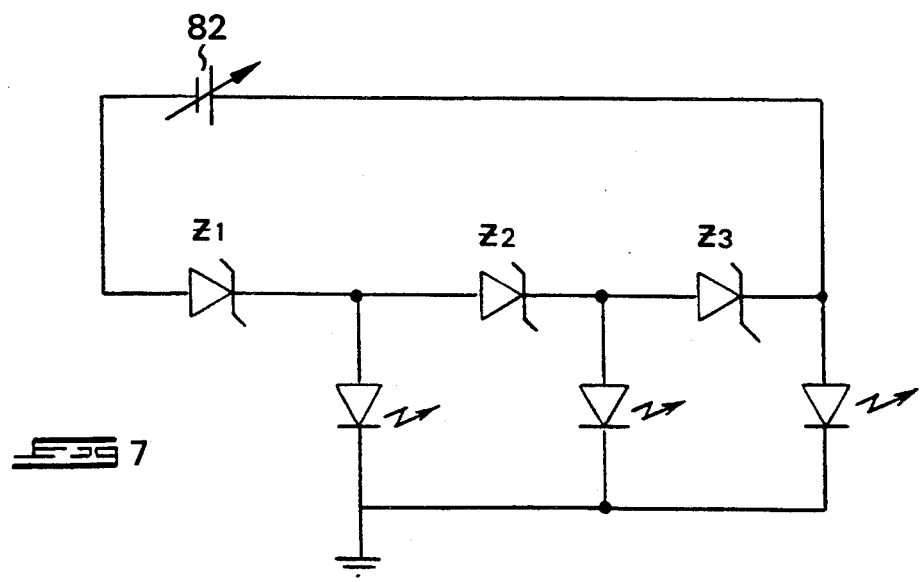
FIG. 7 is an equivalent circuit of the light emitting device of FIG. 6.

Referring now to FIGS. 6 and 7, a visible voltage indicator or regulator and its respective equivalent circuit is shown in which a variable voltage source 82 is connected in series with three zener diodes Z1, Z2 and Z3, having respective breakdown voltages V1, V2 and V3. The First zener diode Z1 is connected between the negative terminal of the voltage source 82 and the indium tin oxide contact 52, the second zener diode Z2 is connected between the contacts 52 and 66, and the third zener diode is connected between the contacts 66 and 76. The voltage regulator 80 has a patterned aluminum base 84 with windows 86, 88 and 90 formed therein. Both the electrical contact 29 and the aluminium base 84 are earthed to prevent a build up of charge in the diamond crystal layer 10.

When a voltage level V1 is applied across the terminals, the region 16 emits green light through the window 86. When the voltage is stepped up to V2, the region 18 emits blue light through the window 88, and when the voltage is raised to V3, the region 20 emits red light through the window 90.

This embodiment can be used as a visible voltage indicator or regulator. Green light is emitted if the voltage V1 is applied, both green and blue light is emitted if the voltage V2 is applied, and green, blue and red light is emitted if the voltage V3 is applied.

Colour sensitive detectors, such as photodiodes, phototransistors or photomulitiplier tubes with various filter combinations could be used to provide a voltage signal output from the various coloured light outputs.

I claim:
1. A light emitting device comprising:
    a substrate of transparent intrinsic diamond material having a p-type region formed therein;
    a first transparent layer of diamond material deposited over the p-type region and covering at least a portion thereof;
    at least one optically transparent conductive contact on or adjacent to the first transparent layer, said at least one optically transparent conductive contact being transparent to visible light; and
    a conductive contact applied to the first p-type region.

2. A light emitting device according to claim 1 wherein the first transparent layer of diamond material comprises at least two discrete regions.

3. A light emitting device according to claim 2 wherein each discrete region is provided with a respective transparent conductive contact.

4. A light emitting device according to claim 2 wherein the at least two discrete regions comprise diamond material of different electrical properties.

5. A light emitting device according to claim 4 wherein at least a first one of the discrete regions comprises boron doped diamond deposited by a CVD process.

6. A light emitting device according to claim 4 wherein at least a second one of the discrete regions comprises intrinsic diamond.

7. A light emitting device according to claim 4 wherein at least a third one of the discrete regions comprises diamond deposited by a high growth rate plasma jet CVD process.

8. A light emitting device according to claim 4 wherein adjacent discrete regions are separated by a transparent insulating layer.

9. A light emitting device according to claim 1 wherein the at least one transparent conductive contact comprises a layer of indium tin oxide.

10. A light emitting device according to claim 1 wherein the substrate of transparent intrinsic diamond material is attached to a reflective metallic base.

11. A voltage indicating device comprising a light emitting device according to claim 9 and including at least one voltage dependent device connected between the conductive contacts of adjacent discrete regions, so that the respective regions will emit light at different applied voltages when the device is connected to a variable voltage source.

12. A voltage indicating device according to claim 11 wherein the at least one voltage dependent device is a zener diode.

13. A light sensitive logic device comprising a light emitting device according to claim 2, wherein the p-type region in the substrate has p+ characteristics, a pair of spaced apart discrete regions of diamond material deposited thereon and being separated by a region of insulating material, a metallic layer deposited over the discrete regions and the insulating region, a layer of intrinsic diamond deposited on the metallic layer, and a transparent conductive contact deposited on the layer of intrinsic diamond, thereby defining an optical OR gate with first and second optical inputs corresponding to the pair of spaced apart discrete regions.

14. A light sensitive logic device comprising a light emitting device according to claim 2, wherein the p-type region in the substrate comprises first and second spaced apart p+ regions, respective first and second spaced apart layers of intrinsic diamond material deposited thereon, respective first and second metallic layers deposited on the first and second layers of intrinsic diamond material, with the first metallic layer in contact with the second p-type region, a further layer of diamond material deposited on the second metallic layer, and a transparent conductive contact deposited on the further layer of diamond material, thereby defining an optical AND gate with first and second optical inputs corresponding to the pair of spaced apart discrete p+ regions.

15. A light sensitive logic device comprising a light emitting device according to claim 2, wherein the p-type region in the substrate comprises first and second spaced apart p+ regions separated by a p-type region, respective first and second spaced apart layers of diamond material deposited on the p+ regions and separated by a layer of insulating material deposited on the p-type region, a metallic layer deposited on the first layer of diamond material and the layer of insulating material, and a transparent conductive contact deposited on the second layer of diamond material, thereby defining an optical NOT gate with an optical input corresponding to the first and second p+ regions.

* * * * *

UNITED STATES PATENT AND TRADEMARK OFFICE
CERTIFICATE OF CORRECTION

PATENT NO. : 5,347,147
DATED : September 13, 1994
INVENTOR(S) : Barbara Lynn Jones It is certified that error appears in the above-indentified patent and that said Letters Patent is hereby corrected as shown below:

In the Abstract, line 5: "electric" should read --electrical--

Column 3, lines 8 & 9: "regions 38 separated" should read --regions 36 and 38 separated--

Column 4, line 68, Claim 11: "claim 9" should read --claim 4--

Signed and Sealed this

Twentieth Day of June, 1995

*Attest:*

BRUCE LEHMAN

*Attesting Officer*     *Commissioner of Patents and Trademarks*